United States Patent [19]

Nozawa et al.

[11] Patent Number: 4,481,606
[45] Date of Patent: Nov. 6, 1984

[54] FILE DELETION METHOD IN BUBBLE CASSETTE MEMORY, AND BUBBLE CASSETTE MEMORY CONTROL APPARATUS

[75] Inventors: Ryoichiro Nozawa, Tokyo; Nobuyuki Kiya, Hachioji, both of Japan

[73] Assignee: Fanuc Limited, Tokyo, Japan

[21] Appl. No.: 300,213

[22] Filed: Sep. 8, 1981

[30] Foreign Application Priority Data

Sep. 25, 1980 [JP] Japan ................... 55-133306

[51] Int. Cl.³ .................. G11C 19/08; G11C 11/14
[52] U.S. Cl. ......................... 364/900; 365/1
[58] Field of Search ... 364/200 MS File, 900 MS File; 365/1

[56] References Cited

U.S. PATENT DOCUMENTS

| | | | |
|---|---|---|---|
| 3,427,596 | 2/1969 | Hertz | 364/900 |
| 3,737,881 | 6/1973 | Cordi et al. | 365/1 |
| 3,967,263 | 6/1976 | Chang et al. | 364/900 |
| 4,009,471 | 2/1977 | Tanaka et al. | 364/200 |
| 4,021,791 | 5/1977 | Bobeck et al. | 365/1 |
| 4,037,205 | 7/1977 | Edelberg et al. | 364/900 |
| 4,161,788 | 7/1979 | Rosenblum | 364/900 |
| 4,221,003 | 9/1980 | Chang et al. | 364/900 |
| 4,225,941 | 9/1980 | Moran | 364/900 |
| 4,283,771 | 8/1981 | Chang | 364/900 |
| 4,308,593 | 12/1981 | Young et al. | 365/1 |

OTHER PUBLICATIONS

IBM Technical Disclosure Bulletin, vol. 19, No. 1, Jun. 1976, pp. 169-170, New York, "Selective Ring Modification with Check Pattern", T. Stranko et al.
IBM Technical Disclosure Bulletin, vol. 17, No. 8, Jan. 1975, pp. 2503-2506, New York, "Magnetic Bubble Domain Storage Structures for Sequential Files".

Primary Examiner—Gareth D. Shaw
Assistant Examiner—Daniel K. Dorsey
Attorney, Agent, or Firm—Staas & Halsey

[57] ABSTRACT

A method and apparatus for deleting a file from a bubble cassette memory. A file, constituting one input unit of data to be written into the cassette memory, is divided into a plurality of blocks each comprising a predetermined number of bytes and is thereafter stored in the cassette memory. In similar fashion a plurality of such files are stored in the cassette memory in numerical order. When a command for deletion of the n-th file $F_n$ is generated, files which were originally stored in the cassette memory following the n-th file $F_n$ are stored successively and in block-by-block fashion in the cassette memory starting from the position at which the n-th file $F_n$ was originally stored.

13 Claims, 6 Drawing Figures

FILE DELETION METHOD IN BUBBLE CASSETTE MEMORY, AND BUBBLE CASSETTE MEMORY CONTROL APPARATUS

BACKGROUND OF THE INVENTION

The subject matter of this application is related to the subject matter of copending U.S. application Ser. No. 299,500.

This invention relates to a method and apparatus for file deletion in a bubble cassette memory and, more particularly, to a method and apparatus for deleting a file in a bubble cassette memory for storing a machining or part program.

In numerical control devices having an internal memory for storing a part program, it is conventional practice to use a paper tape as a storage medium for writing the part program into the memory and for preserving the information which is stored in the memory. A tape reader and tape puncher are connected to the numerical control device, the former for transferring data from the tape to the internal memory, and the latter for reversing the process. A system of this type which relies upon a paper tape storage medium is not entirely satisfactory since the paper tape has a comparatively short life, is difficult to handle and does not always provide the desired reliability since reading errors are often encountered. Moreover, system costs are raised due to the tape reader and puncher.

In recent years cassette memories of the type that rely upon magnetic bubbles have been developed as storage media to replace the older paper tape configurations. Numerical control systems employing such bubble cassette memories have been disclosed and put into practical use. In such numerical control systems, single units or files of machining data such as machining programs delivered consecutively by a numerical control device are stored in a number of bubble cassette memories. In processing a machining program the desired machining program is read out of the bubble cassette memory holding the program and is stored in a memory located within the numerical control device. Numerical control processing is then performed by the numerical control device in accordance with that particular machining program.

When a number of machining programs have been stored in a bubble cassette memory in the manner described above, there are occasions where an operator may wish to delete one of the machining programs from the memory. For example, a situation may arise in which an NC machining operation on the basis of the machining program is no longer required. When such is the case it is preferred that the unnecessary machining program be deleted from the bubble cassette memory to create a blank portion into which a new machining program may be written, for then more effective use can be made of the bubble cassette memory. When an unnecesary or old machining program is merely deleted from memory, however, the new machining program, if it is longer than the old program, cannot be stored in the blank portion formerly occupied by the old program. On the other hand, when the new program is shorter than the old, storage in said blank area from which the old program has been deleted is possible but results in some blank space being left over. It is therefore not possible to exploit the bubble cassette memory effectively.

Methods do exist for deleting a record from a magnetic disc or magnetic tape. For example, refer to "Introduction to File Compilation" by Masaki Yamatani, published July 25, 1980, pp. 35 to 43. Specifically, a method of deleting a record from a magnetic disc device includes steps of (1) reading the master record to be deleted, (2) tagging a specific data field of the master record to indicate deletion, and (3) writing the master record back into its original location. With this method, however, a blank space is not created following deletion of the record, thereby preventing effective utilization of the memory. A method of deleting a record from a magnetic tape device includes steps of (1) providing two magnetic tapes, one constituting the old master file which stores the record that is to be deleted, and the other constituting a new master file, (2) providing a deletion record having a key field identical with that of the master record to be deleted, (3) reading master records from the old master file sequentially to discriminate whether the respective key fields coincide with the key field of the deletion record, (4) writing a master record, which has been read from the old master file, directly into the new master file when the key field of that record does not coincide with the key field of the deletion record, and then reading the next master record, (5) refraining from writing a record into the new master file when its key field does coincide with the key field of the deletion record, and (6) repeating the foregoing steps to store only the required records in the new master file without a blank space, formed by deleting a record, being left between adjacent records in the new master file. With this method, however, two master files, the new and the old, are required, and considerable processing time is expended. The result is an increase in apparatus size and higher operating costs.

The foregoing conventional methods of deleting data in magnetic tapes and discs can be applied directly to bubble cassette memories but are unsatisfactory in terms of effective memory utilization, processing time and cost, as described above.

SUMMARY OF THE INVENTION

Accordingly, an object of the present invention is to provide a method and apparatus for file deletion in a bubble cassette memory to permit deletion of an arbitrary file in a simple manner and to permit effective utilization of the bubble cassette memory.

Another object of the present invention is to provide a method and apparatus for file deletion through which it is possible to readily retrieve the location of a file which is to be deleted.

Still another object of the present invention is to provide a method and apparatus for file deletion through which it is possible to delete a file in a short period of time using a simple and inexpensive arrangement.

Other features and advantages of the invention will be apparent from the following description taken in connection with the accompanying drawings.

DESCRIPTION OF THE PREFERRED EMBODIMENT

Figure 1:
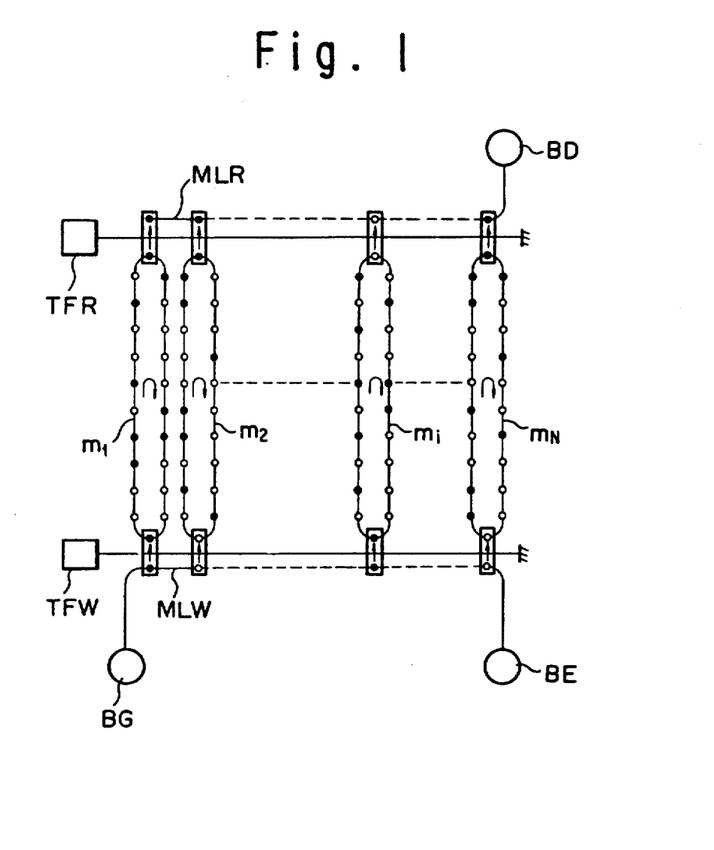
FIG. 1 is an illustrative view useful in describing information read and write operations in a magnetic bubble memory of the type having a major-minor loop configuration.

Referring first to FIG. 1, $m_1, m_2, m_3, \ldots, m_N$ denote minor loops which are a total of N in number. Each minor loop is a closed loop comprising a bubble domain transfer track of 2M bits. The loop may, for example, consist of a series of T bar patterns. BG denotes a bubble generator, BE a bubble eraser, MLR a major line for reading only, and MLW a major line for writing only. The minor loops $m_1, m_2, \ldots, m_N$ are arranged with one end adjoining the major line MLR and the other end adjoining the major line MLW. When a transfer command is issued by a transfer site TFR, those bubble domains (indicated by the black circles) which at that instant are at the bit positions in the minor loops $m_1, m_2, \ldots, m_N$ that are in the transfer area of the read-only major line MLR, i.e., that are at the exits of the minor loops, are transferred to the read-only major line MLR. On the other hand, when a transfer command is issued by a transfer site TFW, those bubble domains (indicated again by the black circles) which have been written into the write-only major line MLW are transferred to the minor loops $m_1, m_2, \ldots, m_N$ at the areas where the minor loops are adjacent the major line MLW, i.e., at the entrances to the minor loops. A magnetic bubble memory of the major-minor loop configuration of this type is well known and is described in, for example, the booklet entitled "Fujitsu Bubble Memory Technical Information", 1979, published by Fujitsu Limited.

The process for a read operation takes place as follows. In reading one access unit of stored information comprising N bits, bubble domains in the N-number of minor loops $m_1, m_2, \ldots, m_N$ are transferred in parallel to the read-only major line MLR in response to the transfer command. In the magnetic bubble memory of FIG. 1, if we let the information of 2M bits stored in each minor loop $m_i$ (where $i = 1, 2, \ldots, N$) be expressed by $b(i,1), b(i,2), \ldots, b(i,2M-1), b(i,2M)$, then one access unit of stored information will be taken to mean N-bit information comprising the bits expressed by $b(1,j), b(2,j), \ldots, b(N,j)$, where $j = 1, 2, \ldots, 2M$. In the following, one access unit of stored information comprising N bits is referred to as a block.

The bubble domains which have been transferred to the read-only major line are shifted bit-by-bit successively within the read-only major line MLR to provide an output of serial data. Accordingly, when a bubble detector BD such as one which relies upon magneto-resistance is provided at the exit from the read-only major line MLR, the output data may be read by sensing the absence or presence of the bubble domains. It should be noted that, in a read operation, destructive and non-destructive read operations may be performed. In the destructive read operation, one access unit (one block) of the bubble domains in the minor loops $m_1, m_2, \ldots, m_N$ is destroyed as it is read. This does not occur in the non-destructive read operation. It is customary for information to be read in such a non-destructive manner in an ordinary read operation.

In a rewrite operation, however, the following steps are performed. First, a prescribed single access unit or block of information contained in the minor loops $m_1, m_2, \ldots, m_N$ is erased by a destructive read operation. This steps constitutes a so-called erase cycle. Since each of the minor loops $m_1$ through $m_N$ comprises 2M bits, M bits separate the read-only major line MLR from the write-only major line MLW. Therefore, for 2M cycles of the rotating field which drives the bubbles, the bubble domains in each of the minor loops $m_1$ through $m_N$ make one complete revolution; for M cycles, the bubbles make only one-half of a revolution. Thus the information which is stored in the minor loops $m_1$ through $m_N$ in the form of the bubble domains at the loop positions adjacent the read-only major line MLR is advanced to the other end of the loops positioned adjacent the write-only major line MLW. The entrances to the minor loops $m_1$ through $m_N$ are situated at these positions. Accordingly, following the destructive read operation, and after rotating the field by M cycles, the next step is to transfer N-bit information, which has previously been generated in the write-only major line MLW, to the respective minor loops $m_1$ through $m_N$ in parallel fashion, the transfer being effected by a transfer command issued by the transfer site TFW. Thus, this step, or so-called write cycle, writes the new information into the positions (all zeros) cleared by the destructive read and completes the rewrite processing operation.

Figure 2:
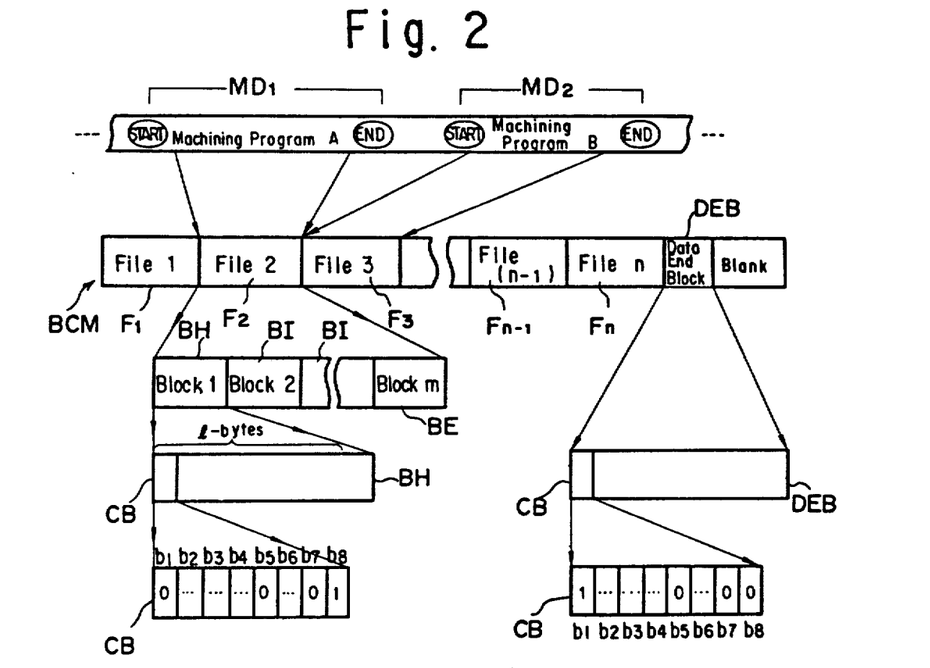
FIG. 2 is an illustrative view useful in describing a bubble cassette memory data configuration.

Reference will now be had to FIG. 2 which illustrates the configuration of data in a file in accordance with the present invention. $MD_1$, $MD_2$ denote machining programs delivered by a numerical control device, each program constituting a file. The files are denoted by $F_i$ ($i = 1, 2, \ldots, n$). The files are stored consecutively, i.e., successively in numerical order, in the bubble cassette memory BCM. DEB is a data end block stored immediately after the last file. The blocks that make up one file are represented by BH, BI, BE. BH is the beginning or head block of a file, BE is the last or end block of the file, and BI denotes the intermediate blocks between the head and end blocks BH, BE, respectively. Each block is composed of l bytes, with control information being stored in the eight bits $b_1$ through $b_8$ constituting the first or head byte of each block. This byte is referred to as a control byte CB. Logical "1" is stored in the eighth bit $b_8$ of the control byte CB in the head block BH, in the seventh bit $b_7$ of the control byte in each of the intermediate blocks BI, in the fifth bit $b_5$ of the control byte in the last block BE, and in the first bit $b_1$ of the control byte in the data end block DEB.

Figure 3:
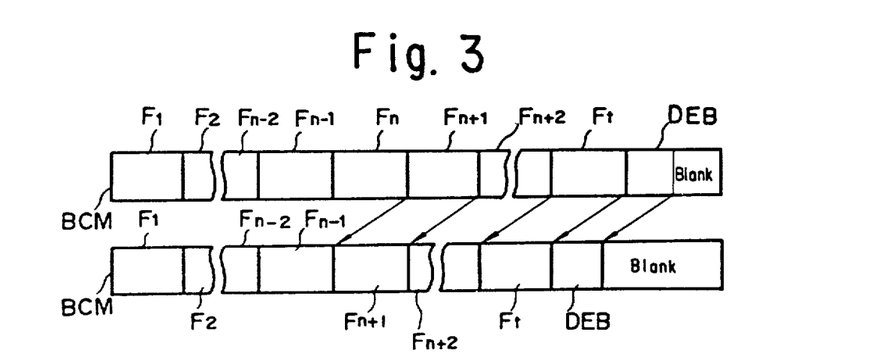
FIG. 3 is an illustrative view useful in describing the gist of a method of file deletion in a bubble cassette memory in accordance with the present invention.

FIG. 3 is useful in describing how a file is deleted from a bubble cassette memory in accordance with the method of the invention. Portions corresponding to those shown in FIG. 2 are designated by like reference characters. Assume that the n-th file $F_n$ is to be deleted. In accordance with the present invention, once the file $F_n$ is deleted in a manner to be described below, the subsequent $(N+1)$-th file $F_{n+1}$, $(n+2)$th file $F_{n+2}, \ldots$, last file $F_l$ and data end block DEB are stored in the bubble memory successively starting from the position at which the head block of the n-th file $F_n$ was originally stored. Deleting the n-th file and then storing the subsequent files and the data end block in the manner described combines the blank space, which was originally occupied by the n-th file $F_n$, with the blank space that follows the data end block DEB.

Figure 4:
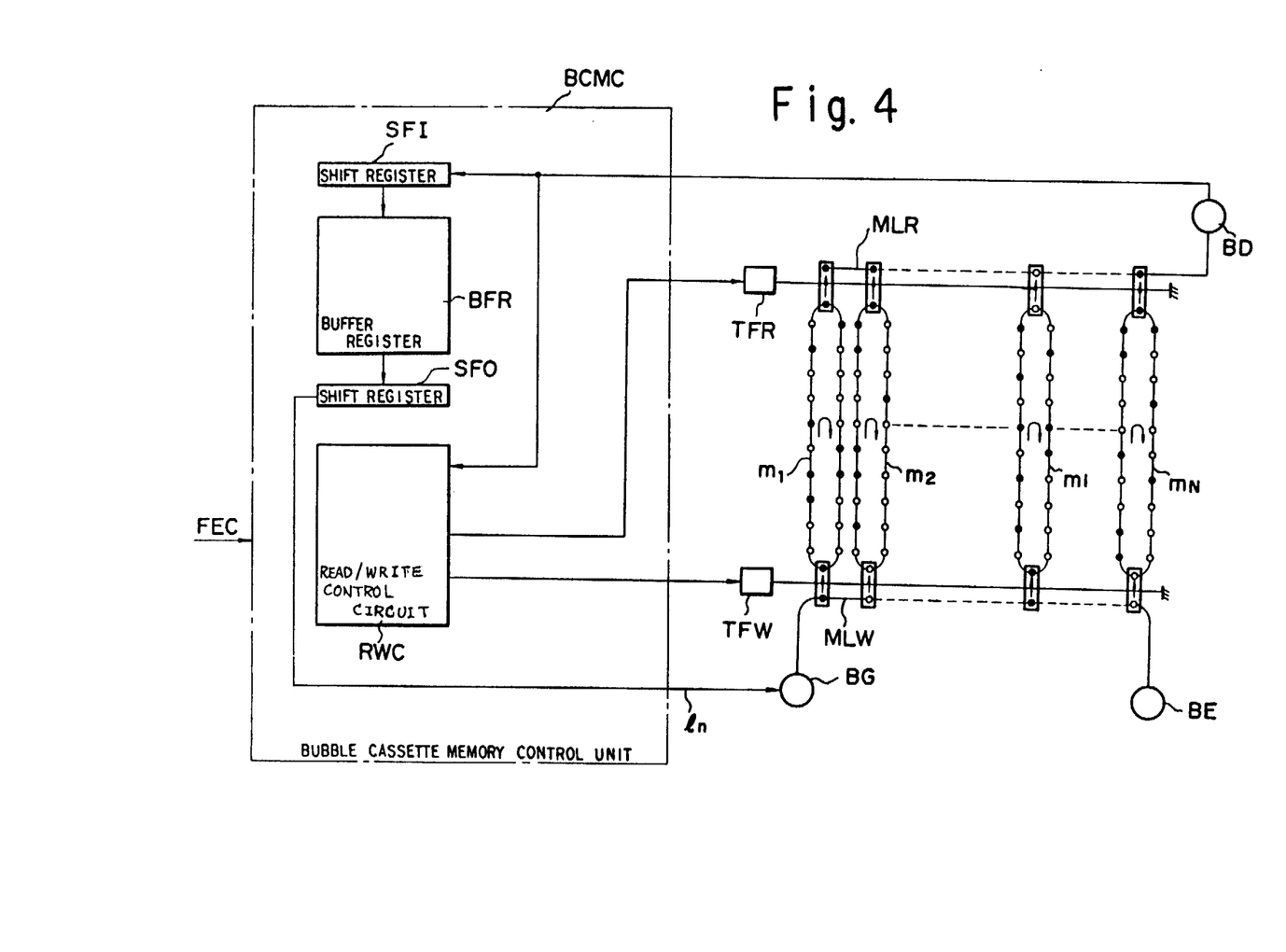
FIGS. 4 and 5 are block diagrams showing first and second embodiments of an appratus for practicing the file deletion method of the present invention.

Reference will now be had to FIG. 4 which is a block diagram of a bubble cassette memory control apparatus for practicing the inventive method of deleting a file from a bubble cassette memory. Portions corresponding to those of FIG. 1 are denoted by like reference characters.

The bubble cassette memory control apparatus, designated BCMC, includes N-bit shift registers SFI, SFO, a read/write control circuit RWC, and a buffer register BFR. The shift register SFI shifts in and stores, bit-by-bit, the output of the bubble detector BD. When one access unit or one block (N bits) of information has been stored, the information is written into the buffer register BFR in a parallel manner. The number of bits in one block is equivalent to the number of minor loops, namely N, as mentioned above. This is the number of bits in each one of the block shown in FIG. 2. Thus, when one block consists of l bytes (one byte being composed of eight bits), N is equivalent to 8l bits, i.e., N=8l bits. The buffer register BFR, having a storage capacity of a plurality of blocks of information, stores successively the single blocks of information stored and then delivered by the shift register SFI, and is adapted to deliver this information to the shift register SFO block-by-block in parallel fashion. The shift register SFO, while shifting in bit-by-bit the single blocks of information read out in parallel fashion from the buffer register BFR, delivers the information serially on line $l_n$.

The arrangement of FIG. 4 operates in the following manner to delete the n-th file $F_n$ as described briefly in connection with FIG. 3. First, a numerical control device, which is not illustrated in the drawings, issues a file deletion command FEC for deleting the n-th file $F_n$. When the head block of the file $F_n$ reaches the transfer positions adjacent the read-only major line MLR following the issuance of the file deletion command FEC, the read/write control circuit RWC causes the transfer site TRF to successively deliver transfer commands so that each bit of information (the absence or presence of a bubble) in the head block of the file $F_n$ is read destructively by the read-only major line MLR. When this has been performed the second, third and subsequent blocks up to and including the last block of the file $F_n$ are read destructively in the manner described, whereby the file $F_n$ is deleted. Next, when the head block of the (n+1)th file $F_{n+1}$ arrives at the transfer positions adjacent the read-only major line MLR, the transfer site TFR, under the control of the read/write control circuit RWC, successively delivers transfer commands so that each bit of information in the head block of the file $F_{n+1}$ is read destructively by the read-only major line MLR. The block of information read at the major line MLR enters the bubble detector BD while being shifted one bit at a time. Th bubble detector BD detects the absence or presence of bubbles bit-by-bit, delivering a "1" when a bubble is present, and a "0" in the absence of a bubble. This information is stored sequentially and serially in the shift register SFI. When the total information in one block has thus been stored in the shift register SFI, the block of information is transferred to and stored in the buffer register BFR in parallel fashion. Thus, through the foregoing operation, the information in the head block of the (n+1)th file $F_{n+1}$ is stored in the buffer register BFR. This operation is repeated to store the second through the last block of the (n+1)th file $F_{n+1}$ in the buffer register BFR. When this has been accomplished, the information in the head block is transferred from the buffer register BFR to the shift register SFO, where the information is shifted in bit-by-bit while being sent to the bubble generator BG through the line $l_n$. The bubble generator BG generates bubbles sequentially in accordance with the "1", "0" logic in each bit of the head block, the bubbles being shifted into the write-only major line MLW. When one full block of information has been delivered to the write-only major line MLW, and when the bit positions of the minor loops that formerly stored the head block of the destroyed n-th file $F_n$ have arrived at the transfer positions adjacent the write-only major line MLW, the transfer site TFW issues a transfer command. In response thereto, the information in the head block of the (n+1)th file $F_{n+1}$, which has been delivered to the write-only major line in the manner described above, is now written into the abovementioned minor loop bit positions formerly occupied by the head block of the n-th file $F_n$. This operation is repeated to write in the second through the last block of the (n+1)th file $F_{n+1}$. In accordance with the foregoing sequence of steps, the (n+1)th file $F_{n+1}$ will be written back into the bubble memory at a location immediately following the (n−1)th file $F_{n-1}$. Writing the (n+2)th file $F_{n+2}$, the (n+3)th file $F_{n+3}$ and so on up to and including the last file in the aforesaid manner completes file deletion processing in accordance with the present invention.

Figure 5:
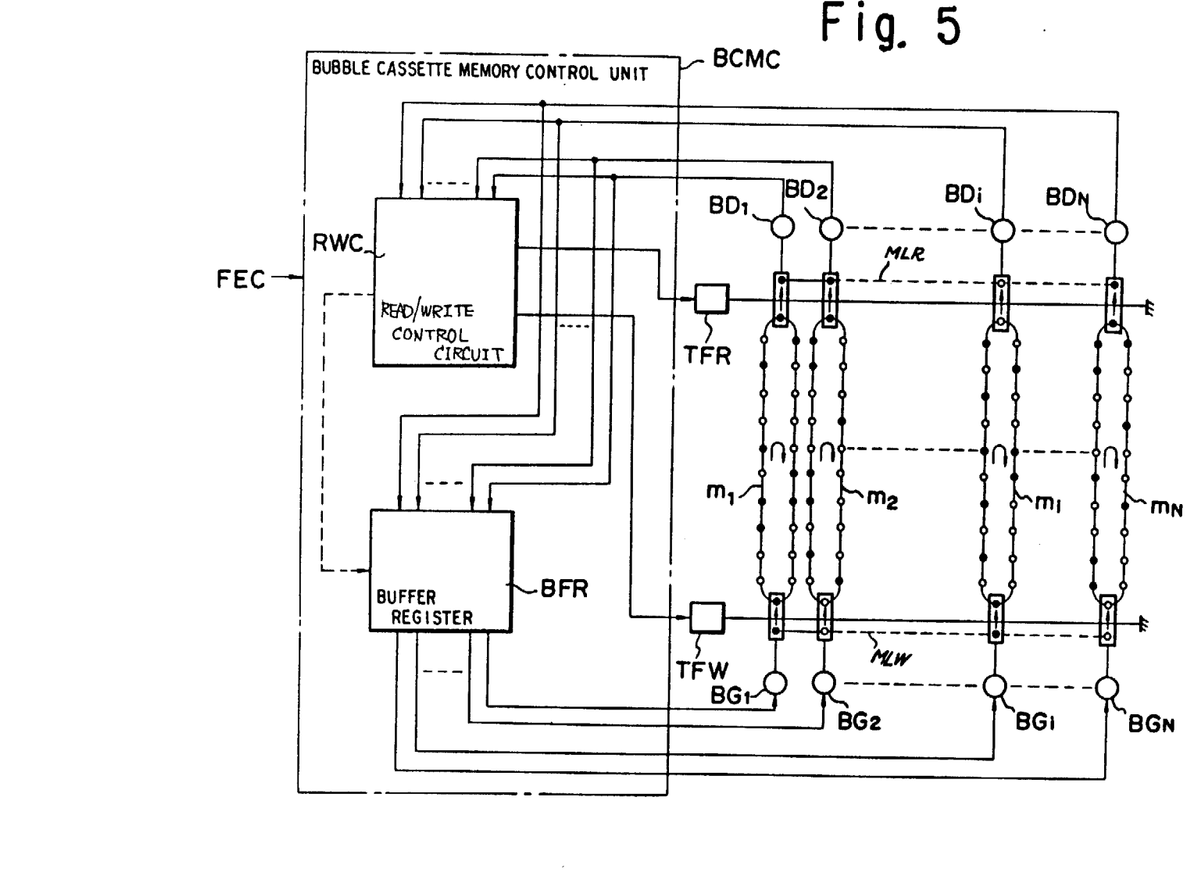

In the embodiment described above, one bubble generator BG and one bubble detector BD are provided for the entire array of minor loops. FIG. 5 illustrates another embodiment of the arrangement in which a bubble detector $BD_i$ (i=1, 2, ..., N) and bubble generator $BG_i$ (i=1, 2, ..., N) are provided for each one of the minor loops. Portions corresponding to those of FIG. 4 are denoted by like reference characters.

In accordance with the embodiment of FIG. 5, each block of information from the head block of the n-th file $F_n$ to the end block DEB is consecutively read and destroyed and, in concurrence with the destructive read operation, information in the destroyed files $F_{n+1}$, $F_{n+2}$ that follow the file $F_n$ is written successively in the bubble memory starting from the position at which the head block of the file $F_n$ was originally stored. This permits the deletion operation to be processed in a shorter period of time since the read and write operations can be carried out in rapid fashion.

To be more specific, when the head block of the file $F_n$ arrives at the transfer positions adjacent the read-only major line MLR, information is read destructively until the end block DEB is read. The destructively read blocks of information are stored successively in the buffer register BFR. Meanwhile, by having rotated the driving magnetic field by M cycles following the read-out of the head block in the file $F_n$, the minor loop bit positions formerly occupied by the head block of the file $F_n$ will have been advanced to the transfer positions adjacent the write-only major line MLW. In addition, information in the head block of the file $F_{n+1}$ will have been read out of the buffer register BFR and delivered to the write-only major line MLW. Therefore, by causing the transfer site TFW to issue a transfer command following M cycles of field rotation, the information in the head block of the file $F_{n+1}$ is stored in the minor loops at the bit positions which originally stored the head block of the file $F_n$. Thereafter, each block of information is stored in the minor loops in similar fashion to effect the file deletion as described above in connection with FIG. 3.

Figure 6:
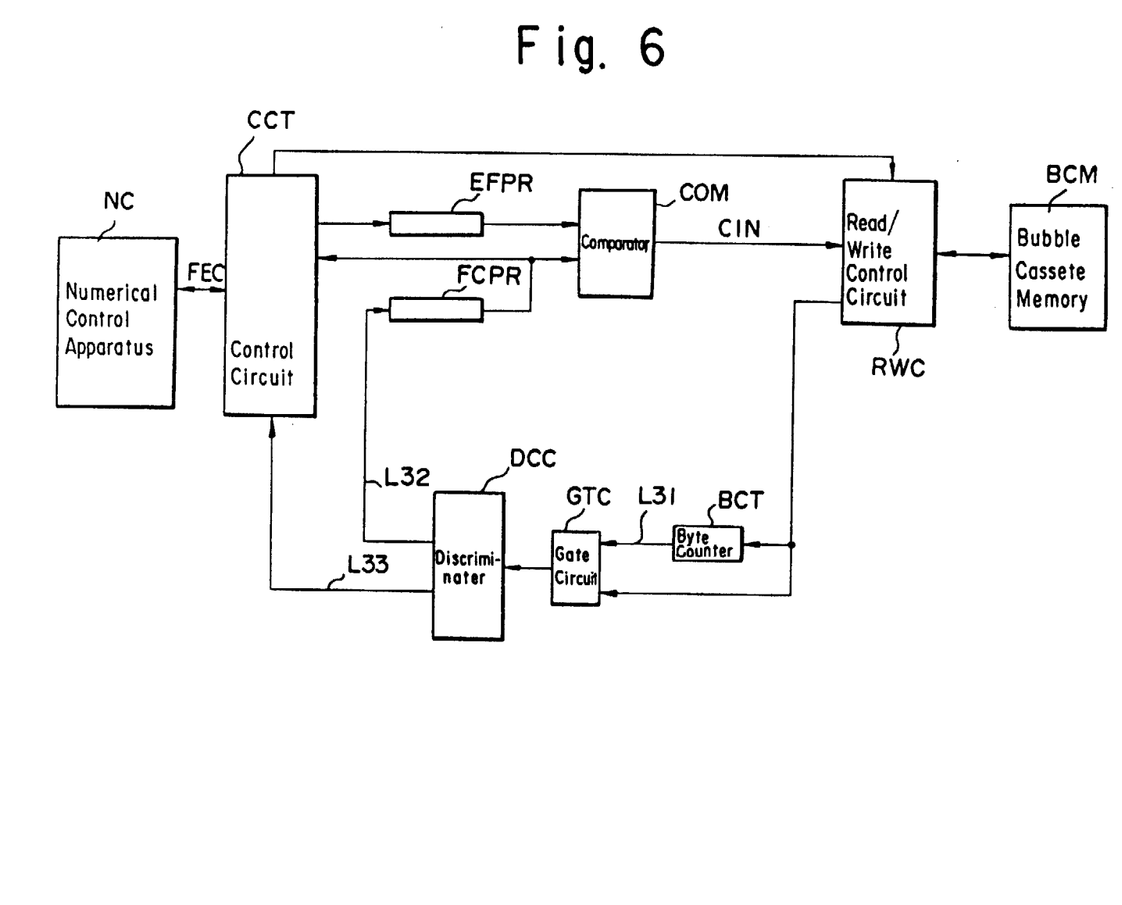
FIG. 6 is a block diagram showing a bubble cassette memory control apparatus for advancing the beginning or head block of a file which is to be deleted, to the exits of the minor loops adjacent a read major line.

FIG. 6 is a block diagram illustrating the principal portions of the bubble cassette memory control apparatus for advancing the head block of the file which is to be deleted, to the exists of the minor loops adjacent the read-only major line. A control circuit CCT controls the deletion of a file in response to a file deletion command FEC when the command is issued by a numerical control device NC. Here the command FEC indicates deletion of the n-th file $F_n$. The read/write control circuit RWC controls read and write operations in the bubble cassette memory BCM in response to signals from the control circuit CCT and from a comparator to be described below. A byte counter BCT, having an l-byte capacity, has its content incremented by +1 each time one byte of data is read out of the bubble cassette memory BCM through the read/write control circuit RWC. The output of the byte counter BCT, delivered on line $L_{31}$, is logical "1" when the counter content is zero, and logical "0" at all other times, i.e., when the content is non-zero. The content of the counter BCT is restored to zero each time l bytes of data enter from the read/write control circuit RWC. It will be recalled that the total number of bytes in one block is l. Thus the content of counter BCT will be zero as the first byte, namely the control byte, of each block is read out of the bubble memory, so that the "1" logic will be present on line $L_{31}$ at this time. A gate circuit GTC is open when the content of the byte counter BCT is zero, and closed when the counter content is non-zero. In other words, the gate circuit will pass only the control data in each block as it arrives from the read/write control circuit RWC. A discriminator DCC delivers logical "1" on line $L_{32}$ when a "1" is found to be stored in the eighth bit $b_8$ of a control byte, or line $L_{33}$ when a "1" is found to be stored in the first bit $b_1$ of the control byte. In other words, the discriminator DCC examines the control data arriving via the gate circuit GTC and delivers a "1" on line $L_{32}$ when the head block BH of a file is read out of the bubble memory, or on line $L_{33}$ when the data end block is read out of the bubble memory. A deletion file position register EFPR stores the position of the file to be deleted, where "position" means the ordinal number of the file from the head or first file. For example, when the numerical control device NC issues a file deletion command FEC calling for deletion of the i-th file, the numerical value i is stored in the deletion file position register EFPR. A current file position register FCPR is incremented by +1 each time a "1" arrives on line $L_{32}$ and thus stores the position of the file which is currently being read from the bubble memory. A comparator COM is adapted to deliver a coincidence signal CIN at logical "1" to the read/write control circuit RWC when the deletion file position and the current file position coincide.

In operation, the position n of the deletion file is set in the deletion file position register EFPR under the control circuit CCT when the numerical control device NC delivers the file deletion command FEC instructing deletion on the n-th file. The control circuit CCT concurrently sends a read command to the read/write control circuit RWC which responds by reading data from the head or beginning of the bubble cassette memory BCM, that is, by reading the data successively and non-destructively from the head file. This data enters the byte counter BCT whose content, it will be recalled, is zero as the initial bit of a block is read from the bubble memory, the counter delivering a "1" on line $L_{31}$ at such time. As a result, only the control data of a block is passed by the gate circuit GTC and applied to the discriminator DCC at this time. The discriminator GTC delivers a "1" on line $L_{32}$ each time it receives an item of control data having a "1" stored in the eighth bit $b_8$, each "1" pulse incrementing the current file position register FCPR by +1. Thus, a "1" appears on line $L_{32}$ whenever the control data in a head block is read, the current file position register FCPR having its content up counted by +1 as each "1" pulse arrives from the discriminator. The comparator COM constantly compares the deletion file position n and the current file position and delivers the coincidence signal CIN, namely logical "1", to the read/write control circuit RWC when the two comparator inputs coincide. The read/write control circuit RWC responds to the coincidence signal CIN by halting the non-destructive read operation. When this occurs the head block of the deletion file (file $F_n$) is at the exits of the minor loops adjacent the read-only major line. Now a destructive read operation is performed to delete the file $F_n$ and the files which follow $F_n$. When the data end block is detected, namely the control data having a "1" written in the first bit $b_1$, a "1" appears on line $L_{33}$ and causes the control circuit CCT to send a command, instructing a halt in the destructive read operation, to the read/write control circuit RWC. The destructively read files $F_{n+1}$, $F_{n+2}$ onward, as described above with reference to FIGS. 4 and 5, are written back into the bubble cassette memory, starting from the position formerly occupied by the file $F_n$, in concurrence with the foregoing operation.

The present invention, as will be obvious from the foregoing description, permits a file $F_n$ which is no longer necessary to be deleted quickly and simply merely by means of a file deletion command delivered by a numerical control device. Moreover, since the subsequent files $F_{n+1}$, $F_{n+2}$ onward are written back into the bubble memory from the position formerly occupied by the deleted file $F_n$, the blank space created by deleting the file $F_n$ is placed after the data end block. The same is true for the blanks spaces formed after deleting any other files, all of these blank spaces being combined in the portion of the bubble memory following the data end block. This permits the stoage area of the bubble cassette memory to be exploited to the fullest possible extent. The method of the invention can be used also to edit the data in a single cassette.

As many apparently widely different embodiments of the present invention can be made without departing from the spirit and scope thereof, it is to be understood that the invention is not limited to the specific embodiment thereof except as defined in the appended claims.

What we claim is:

1. A method for deleting a file from a bubble cassette memory included in a system having a numerical control device, the bubble cassette memory having a capacity for storing a predetermined number of files in a sequence, each file comprising one input unit of data and having a predetermined number of blocks comprising a predetermined number of bytes, and a memory control device provided between the numerical control device and the bubble cassette memory for writing data into the bubble cassette memory and for reading data out of the bubble cassette memory, said method including the steps of;

(a) dividing a file into sub-data groups, each sub-data group comprising a predetermined number of bytes;

(b) inserting a control byte into the first byte of each of the sub-data groups, each sub-data group and associated control byte comprising respective blocks;

(c) storing the file in the bubble cassette memory in one block units;

(d) generating a deletion command for initiating the deletion of a specified file $F_n$ from the predetermined number of files stored in the bubble cassette memory; and (e) deleting the specified file $F_n$ from the bubble cassette memory by storing in response to the deletion command, files following the specified file $F_n$, in the bubble cassette memory, the storing starting at the position at which the specified file $F_n$ was originally stored and in the same sequence as the files following $F_n$ were originally stored.

2. A method of deleting a file from a bubble cassette memory according to claim 10, further comprising the steps of:

reading destructively, from the bubble cassette memory in response to said deletion command, the file $F_n$ and the remaining files which follow said file $F_n$;

storing in temporary memory means, other than the bubble cassette memory, the data read from the bubble cassette memory in accordance with the destructive read operation, which data was stored originally in the bubble cassette memory following the file $F_n$; and storing the data, which has been stored in said temporary memory means, in the bubble cassette memory starting from the position at which the file $F_n$ was originally stored and in the same sequence as the remaining files were originally stored.

3. A method of deleting a file from a bubble cassette memory according to claim 2, further comprising the steps of:

inserting a control byte into the beginning of each of said blocks;

writing control information into each control byte, said control information indicating that the block associated with said control byte is the first block of a file;

reading data non-destructively and sequentially from the beginning of the bubble cassette memory in response to said deletion command for deletion of the file $F_n$; and locating the n-th file $F_n$ in accordance with the deletion command and the control information written in said control bytes.

4. A method for controlling a bubble cassette memory according to claim 1, wherein step (e) includes the steps of:

i. reading destructively from the bubble cassette memory, in response to the deletion command, the specified file $F_n$ and the files following the specified file $F_n$;

ii. storing in temporary memory means, other than the bubble cassette memory, the files following the specified file $F_n$, and wherein step (f) includes the step of i. storing the data which has been stored in the temporary means, in the bubble cassette memory, the storing starting from the position at which the specified file $F_n$ was originally stored and in the same sequence as the files following the specified file $F_n$ were originally stored.

5. A method for controlling a bubble cassette memory according to claim 4, wherein step (b) includes the step of:

i. writting control information into the control byte, the control information indicating that the block associated with the control byte is the first block of the file, and wherein step (e) further includes the steps of i. reading data non-destructively and sequentially from the beginning of bubble cassette memory in response to the deletion command for deleting the specified file $F_n$, and ii. locating the specified file $F_n$ in accordance with the deletion command and the control information written into the control byte associated with the specified file $F_n$.

6. A file deletion apparatus for deleting a specified file $F_n$ from a bubble cassette memory, and for storing files in the bubble cassette memory, the bubble cassette memory having a capacity for storing data corresponding to a predetermined number of files in a sequence, each file having a predetermined number of blocks comprising a predetermined number of bytes, said apparatus including;

dividing means, operably connectable to the bubble cassette memory, for receiving the data and for dividing the predetermined number of files into the predetermined number of blocks, each block comprising the predetermined number of bytes, and for inserting a control byte into the first byte of each of the blocks;

determining means, operably connectable to the bubble cassette memory, for determining when a block comprising a control byte is the first block of a file;

writing means, operatively connected to the dividing means, for writing into each control byte, control information indicating that the block associated with the control byte is the first block of a file;

means for generating a deletion command initiating the deletion of the specified file $F_n$ from the predetermined number of files stored in the bubble cassette memory;

reading means responsive to the deletion command and operably connectable to the bubble cassette memory, for destructively reading from the bubble cassette memory, the specified file $F_n$ and files sequentially following the specified file $F_n$;

temporary memory means for storing the files sequentially following the specified file $F_n$ and read by said reading means; and means for storing the files stored in said temporary storage means, in the bubble cassette memory, starting at the location at which the specified file $F_n$ was originally stored and in the same sequence as the files sequentially following the specified file $F_n$ were originally stored.

7. A file deletion apparatus according to claim 6, further comprising means for locating the file $F_n$.

8. A file deletion apparatus according to claim 7, wherein the bubble memory cassette has a major-minor loop configuration.

9. File detection apparatus according to claim 7, where said temporary memory means comprises:

first shift means for receiving, serially, the data read from the bubble cassette memory, and for outputting said data in parallel;

buffer memory means for receiving the parallel data from the first shift means, for storing the data, and for outputting the data in parallel;

second shift means for receiving parallel data from the buffer memory means and for outputting the data serially to the bubble cassette memory.

10. A file detection apparatus according to claim 9, wherein the first shift means and the second shift means each has a capacity to store one block of data, and the buffer memory means has a capacity to store a plurality of blocks.

11. A file detection apparatus according to claim 8, wherein the bubble cassette memory comprises a bubble detector and a bubble generator for each minor loop, and wherein said temporary memory means comprises a buffer memory means operatively connected to each bubble detector and each bubble generator.

12. A bubble cassette memory control apparatus according to claim 6, wherein said apparatus further comprises means for locating the specified file.

13. A bubble cassette memory control apparatus according to claim 6, wherein said temporary memory means comprises;

first shift means for serially receiving the data read from the bubble cassette memory, and for outputting said data in parallel;

buffer memory means for receiving the parallel data from the first shift means, for storing the data, and for outputting the data in parallel;

second shift means for receiving parallel data from the buffer memory means and for outputting the data serially to the bubble cassette memory.

* * * * *

UNITED STATES PATENT AND TRADEMARK OFFICE
CERTIFICATE OF CORRECTION

PATENT NO. : 4,481,606

DATED : November 6, 1984

INVENTOR(S) : Nozawa et al.

It is certified that error appears in the above-identified patent and that said Letters Patent is hereby corrected as shown below:

```
Column 4, line 46, "1 bytes," should be --ℓ bytes,--.
Column 5, line 20, "1 bytes" should be --ℓ bytes--;
          line 21, "81" (both occurrences) should be
--8 ℓ -;
          line 30, "1n" should be --ℓ n--;
          line 56, "Th" should be --The--.
Column 6, line 5,  "1n" should be --ℓ n--.
Column 7, line 16, "1 - byte" should be --ℓ - bytes--;
          line 23, "1 bytes" should be --ℓ bytes--;
          line 25, "is 1" should be --is ℓ --;
          line 48, "i" should be --i--;
          line 57, "n" should be --n--.
Column 8, line 13, "n" should be --n--.
```

Signed and Sealed this

Twenty-sixth Day of March 1985

[SEAL]

Attest:

DONALD J. QUIGG

Attesting Officer    Acting Commissioner of Patents and Trademarks